United States Patent

Hatasawa et al.

[11] Patent Number: 5,852,518
[45] Date of Patent: Dec. 22, 1998

[54] PROJECTION OPTICAL UNIT AND PROJECTION EXPOSURE APPARATUS COMPRISING THE SAME

[75] Inventors: Masato Hatasawa, Yokohama; Masatoshi Ikeda, Tokyo, both of Japan

[73] Assignee: Nikon Corporation, Tokyo, Japan

[21] Appl. No.: 865,933

[22] Filed: May 30, 1997

Related U.S. Application Data

[63] Continuation of Ser. No. 652,761, May 23, 1996, abandoned.

[30] Foreign Application Priority Data

May 26, 1995 [JP] Japan .................................. 7-152220

[51] Int. Cl.⁶ .................................................. G02B 7/02
[52] U.S. Cl. ...................... 359/822; 359/825; 359/694; 359/679; 250/492.2; 250/548; 355/53
[58] Field of Search ......................... 359/824, 822, 359/823, 825, 694, 679; 355/53, 54, 55; 250/492.2, 548

[56] References Cited

U.S. PATENT DOCUMENTS

| | | | |
|---|---|---|---|
| 4,002,405 | 1/1977 | Stahl | 359/823 |
| 4,629,313 | 12/1986 | Tanimoto | 355/53 |
| 4,687,297 | 8/1987 | Kamata et al. | 359/823 |
| 4,924,257 | 5/1990 | Jain | 355/53 |
| 5,091,802 | 2/1992 | Imaoka et al. | 359/694 |
| 5,117,255 | 5/1992 | Shiraishi et al. | 355/53 |
| 5,194,893 | 3/1993 | Nishi | 355/53 |
| 5,260,832 | 11/1993 | Togino et al. | 359/679 |
| 5,424,552 | 6/1995 | Tsuji et al. | 250/548 |

FOREIGN PATENT DOCUMENTS

| | | |
|---|---|---|
| A-0 660 169 | 6/1995 | European Pat. Off. . |
| A-4-355419 | 12/1992 | Japan . |
| A-7-183190 | 7/1995 | Japan . |

*Primary Examiner*—Loha Ben
*Attorney, Agent, or Firm*—Oliff & Berridge, PLC

[57] ABSTRACT

Four specified lenses $22_1$ to $22_4$ of a plurality of lenses in a projection optical unit are subjected to special processing (astigmatic surface processing) so that asymmetric component aberration relative to an optical axis is generated. Each of the lenses $22_1$ to $22_4$ is held by each of secondary lens frames 20 set in each of primary lens frames 14. Each of the secondary lens frames 20 is constructed so that it can be rotated from the outside of a lens barrel 12. The asymmetric component aberration relative to the optical axis of an optical system comprising all lenses for constituting the projection optical unit 10 can be easily corrected by rotating a pair of two of the lenses 22 subjected to the astigmatic surface processing. The projection optical unit is used for a projection exposure apparatus.

38 Claims, 7 Drawing Sheets

PRIOR ART

PROJECTION OPTICAL UNIT AND PROJECTION EXPOSURE APPARATUS COMPRISING THE SAME

This is a continuation of application Ser. No. 08/652,761 filed May 23, 1996 now abandoned.

BACKGROUND OF THE INVENTION

1) Field of the Invention

The present invention relates to a projection optical unit. In particular, the present invention relates to a projection optical unit having a mechanism for adjusting astigmatism. The present invention also relates to a projection exposure apparatus provided with the projection optical unit.

2) Description of the Related Art

Figure 7:
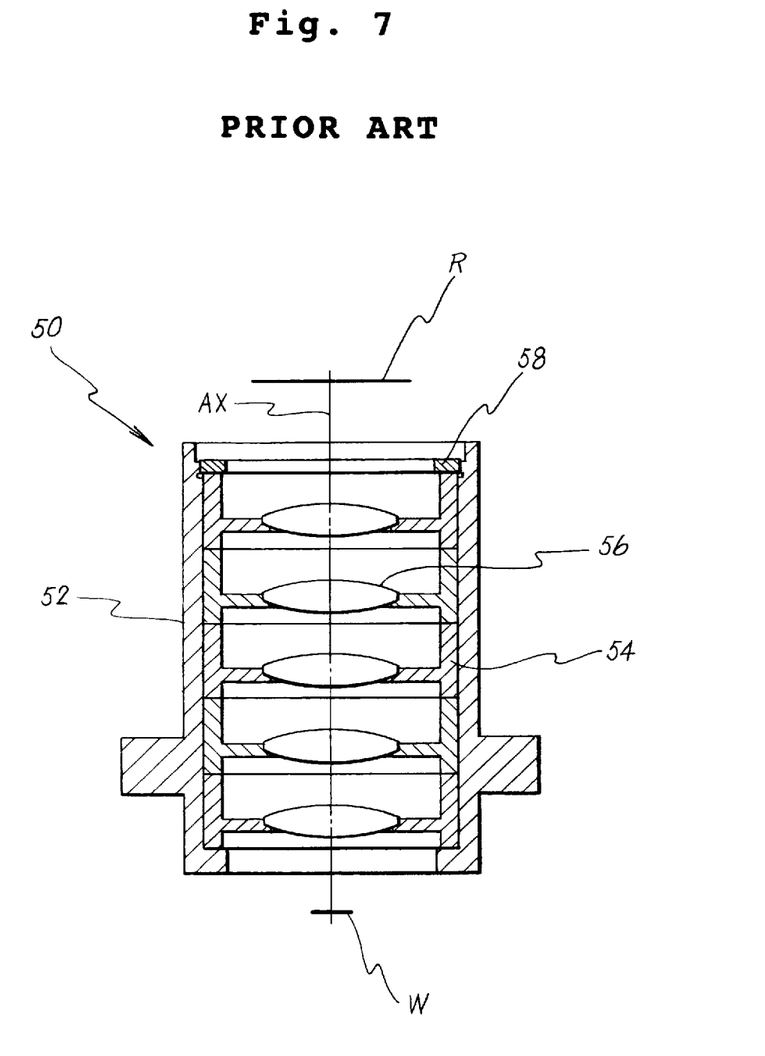
FIG. 7 shows a vertical cross-sectional view illustrating the structure of the conventional projection optical unit.

A projection exposure apparatus is used to form a fine circuit pattern such as a semiconductor circuit on a substrate made of silicon or the like by using a lithography technique. Such a projection exposure apparatus is provided with a projection optical unit for reducing and projecting a circuit pattern formed on a mask onto a photosensitive substrate. FIG. 7 illustrates an example of a cross-sectional structure of a projection optical unit used in a conventional projection exposure apparatus. As shown in FIG. 7, the projection optical unit 50 is arranged between a reticle R as a mask and a wafer W as a photosensitive substrate in the projection exposure apparatus.

The projection optical unit 50 includes a lens barrel 52, a plurality steps of lens frames 54 successively stacked and accommodated in the lens barrel 52, and a plurality of lenses 56, each of the lenses 56 being held by each of the lens frames 54. A female thread is formed on an inner circumferential portion of the lens barrel 52 at a position in the vicinity of an upper end edge of the uppermost lens frame 54 (located nearest to the reticle R) in FIG. 7. A press ring 58 composed of a ring-shaped member, in which a male thread for screwing into the female thread is formed on its outer circumferential portion, is screwed into the inner circumferential portion of the lens barrel 52. Accordingly, all of the lens frames 54 are secured to the lens barrel 52 under a predetermined pressing force (axial tension).

The lens is produced on the basis of an extremely precise designing technique and a processing technique. However, the lens usually involves an error (aberration) which is caused as a result of incomplete image formation. This aberration resides in a geometric optical shift of an image from an ideal image. Such a shift is caused by factors concerning design, processing or the both of them. The aberration includes asymmetric component aberration relative to the optical axis (for example, rhombus distortion and center astigmatism). The term "rhombus distortion" herein refers to an image formation characteristic of an optical system in which, for example, an image of a square object is formed as a rectangle. Namely, the term means a characteristic that an image is formed with magnifications in two orthogonal axial directions in an image plane. The term "center astigmatism" herein means astigmatism on an optical axis.

When a plurality of lenses are successively arranged with a common optical axis AX in the projection optical unit 50 of the conventional example described above, it is necessary that the rotation angle of each of the lenses should be adjusted so that the asymmetric component aberration possessed by each of the lenses is dispersed in a well-balanced manner as a whole. In the present circumstances, however, such adjustment is made by rotating the respective lenses one by one while actually projecting an image. Upon such adjustment, it is necessary to rotate the lens frame 54. In the conventional projection optical unit 50 described above, however, the press ring 58 must be detached, and the lens frames 54, which are located upwardly on and over the lens frame 54 to be rotated, must be detached. This operation is extremely troublesome. Accordingly, the conventional projection optical unit 50 has had an inconvenience that such a troublesome operation must be repeatedly performed until the asymmetric component aberration is corrected to a satisfactory level.

SUMMARY OF THE INVENTION

An object of the present invention is to dissolve such an inconvenience of the conventional technique and provide a projection optical unit in which the asymmetric component aberration can be corrected in a short period of time. Another object of the present invention is to provide a projection exposure apparatus comprising such a projection optical unit.

According to a first aspect of the present invention, there is provided a projection optical unit for projecting a pattern on a mask onto a substrate, comprising:

a barrel;

a plurality of optical elements held coaxially in the barrel;

at least two optical elements of the plurality of optical elements being optical elements which produce asymmetric component aberration relative to an optical axis of the optical elements; and a rotating mechanism for relatively rotating the at least two optical elements about the optical axis respectively;

the rotating mechanism comprising inner optical element frames, which are rotatable in the barrel about the optical axis as a center, for holding the at least two optical elements respectively, and outer optical element frames, which are arranged between the inner optical element frames and the barrel, for rotatably supporting the inner optical element frames.

In order to produce the asymmetric component aberration relative to the optical axis of the lenses in the projection optical unit of the present invention, the at least two lenses described above may be provided as lenses processed to have a shape, namely a so-called saddle configuration in which each of the lenses has mutually different radii of curvature concerning two orthogonal cross sections passing through each of axes of the lenses (See FIGS. 6A–6D). Such processing is hereinafter abbreviated as "astigmatic surface processing", if necessary.

According to the projection optical unit of the present invention, the special processing (astigmatic surface processing) is applied to the at least two specified lenses of the plurality of lenses so that the asymmetric component aberration relative to the optical axis is generated, and the optical unit is provided with the rotating mechanism for independently rotating each of the specified lenses about the optical axis. Therefore, arbitrary asymmetric component aberration relative to the optical axis can be produced by rotating the at least two lenses subjected to the astigmatic surface processing respectively by using the rotating mechanism. Namely, when the two lenses of the lenses subjected to the astigmatic surface processing are relatively rotated as a pair, it is possible to readily correct the asymmetric component aberration relative to the optical axis of the optical system comprising all of the lenses for constituting the projection optical unit.

In the projection optical unit of the present invention, the rotating mechanism is provided as a mechanism capable of rotating each of the lenses subjected to the astigmatic surface processing. Thus the lenses subjected to the astigmatic surface processing can be rotated to set them at arbitrary angles. Accordingly, the image formation characteristic, especially the asymmetric component aberration relative to the optical axis of the optical system for constituting the projection optical unit can be efficiently corrected without disassembling the unit during a production step for the projection optical unit or during a production step after installation of the projection optical unit to a main exposure apparatus body.

In the projection optical unit of the present invention, two lenses of the at least two lenses are arranged adjacent to an end of the lens barrel on a side of the mask, and the two lenses are rotated about the optical axis as a center. Thus the rhombus distortion can be corrected. In another embodiment, two lenses of the at least two lenses are arranged adjacent to the vicinity of a pupil of a lens system in the lens barrel, and the two lenses are rotated about the optical axis as a center. Thus the center astigmatism can be corrected.

According to a second aspect of the present invention, there is provided a projection exposure apparatus for exposing a photosensitive substrate by projection with a pattern on a mask, comprising:

an illuminating unit for illuminating the mask; and a projection optical unit for forming an image of the mask pattern on the photosensitive substrate;

the projection optical unit comprising:

a barrel;

a plurality of optical elements held coaxially in the barrel;

at least two optical elements of the plurality of optical elements being optical elements which produce asymmetric component aberration relative to an optical axis of the optical elements; and a rotating mechanism for relatively rotating the at least two optical elements about the optical axis respectively; and the rotating mechanism comprising inner optical element frames, which are rotatable in the barrel about the optical axis as a center, for holding the at least two optical elements respectively, and outer optical element frames, which are arranged between the inner optical element frames and the barrel, for rotatably supporting the inner optical element frames.

According to the projection exposure apparatus of the present invention, it is possible to easily adjust the image formation characteristics before exposure in a short period of time. Accordingly, the throughput is improved for production of semiconductor devices and the like.

DETAILED DESCRIPTION OF PREFERRED EMBODIMENTS

An embodiment of the present invention will be explained below with reference to FIGS. 1 to 4, however, the present invention is not limited thereto.

Figure 1:
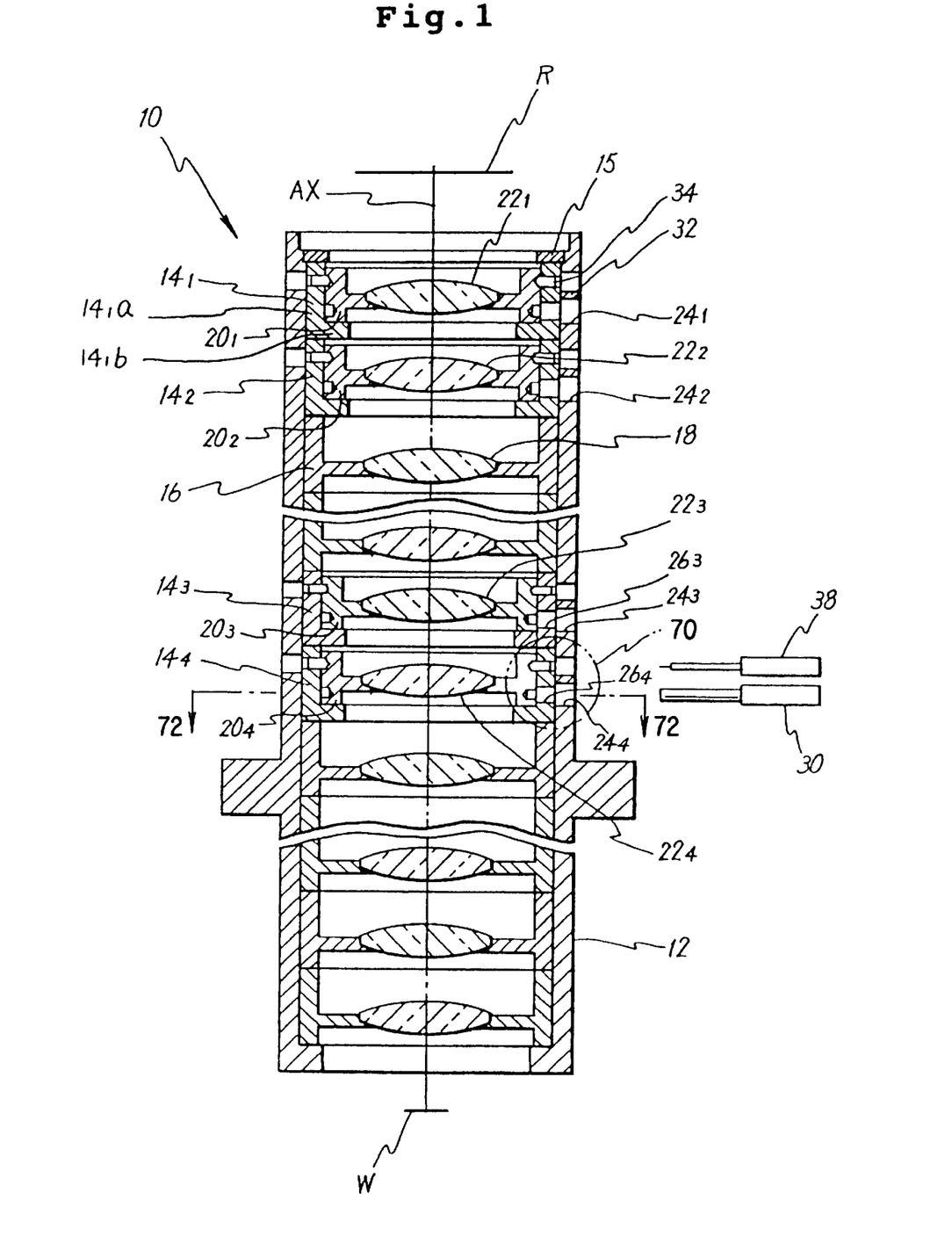
FIG. 1 shows a vertical cross-sectional view of a projection optical unit according to an embodiment of the present invention, as illustrated with omission of a part of a barrel.
Figure 2:
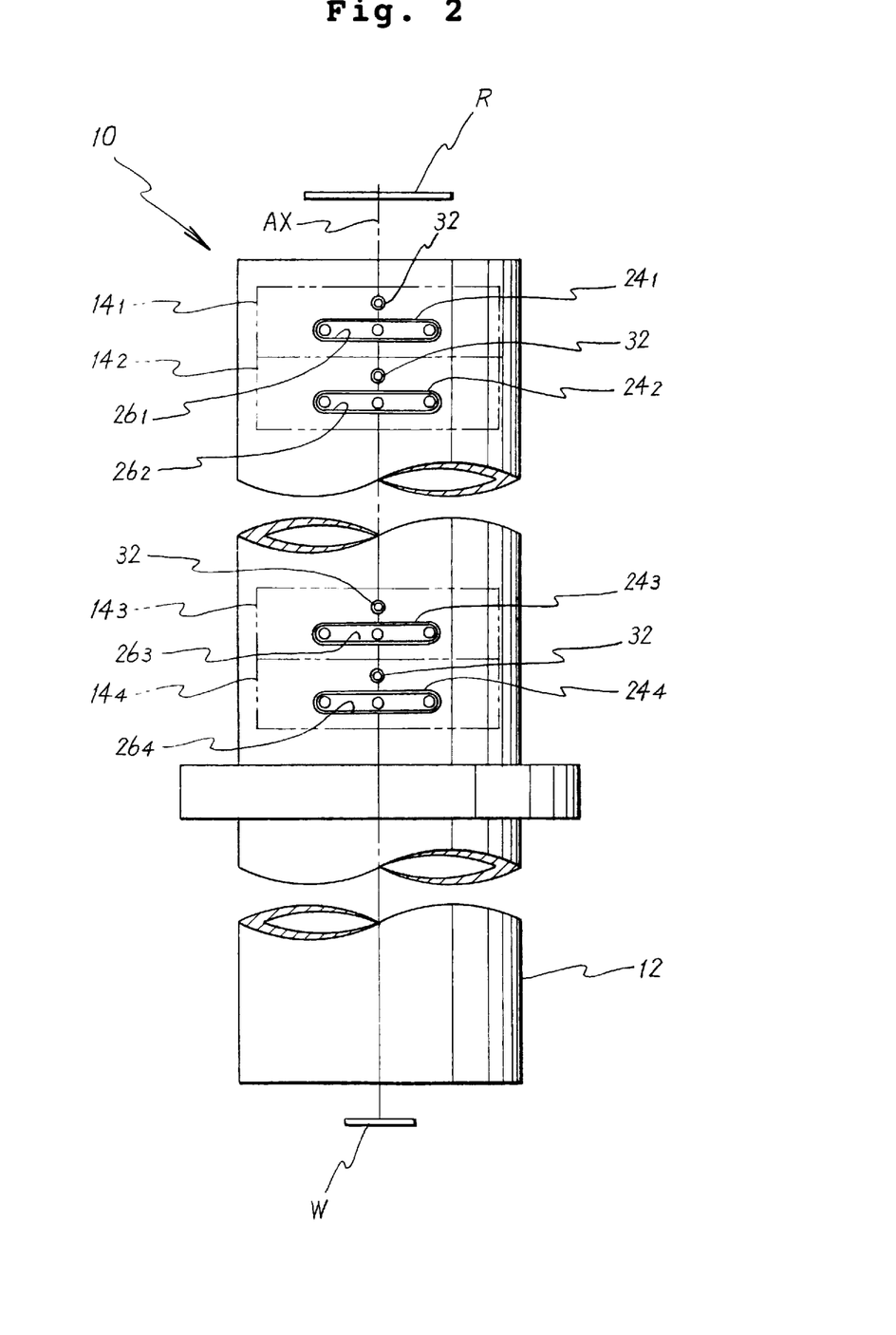
FIG. 2 shows a right side view of the projection optical unit shown in FIG. 1, as illustrated with omission of a part of the barrel.

FIGS. 1 and 2 show a projection optical unit 10 according to one embodiment of the present invention. The projection optical unit 10 is arranged, in a projection exposure apparatus, between a reticle R as a mask and a wafer W as a photosensitive substrate to which a photosensitive material is applied, as shown in FIGS. 1 and 2. The projection optical unit 10 is arranged such that its optical axis AX is positioned on a center of the reticle R. When the reticle R is illuminated with an exposure light beam (not shown) coming from a position over the reticle R in a state in which a pattern plane on the reticle R and a surface of the wafer W are conjugate to one another relative to an optical system (lens system) which constitutes the projection optical unit 10, then a pattern on the reticle R is transferred onto the wafer W while the pattern is reduced depending on a reduction magnification of the projection optical unit 10. An arrangement of the projection exposure apparatus except for the projection optical unit 10 is described, for example, in U.S. Pat. No. 5,424,552. The content of the U.S. Patent is incorporated herein by reference.

The projection optical unit 10 includes a lens barrel 12 composed of a cylindrical member having a predetermined length with its both ends being open, four steps of special lens frames (hereinafter referred to as "primary lens frames") $14_1$ to $14_4$ successively stacked and accommodated in the lens barrel 12, and a plurality steps of ordinary lens frames 16, 16, . . . The primary lens frames $14_1$ to $14_4$ and the lens frames 16, 16, . . . are fixed as a whole to the lens barrel 12 under a predetermined pressing force by a press ring 15 in the same manner as in the conventional example described above. The press ring 15 is composed of a ring-shaped member screwed into the lens barrel 12 to contact with the underlying uppermost primary lens frame $14_1$ (located nearest to the reticle R). Thus a frictional force prevents the primary lens frames $14_1$ to $14_4$ and the lens frames 16, 16, . . . from rotation.

Each of lenses 18 is held by each of the ordinary lens frames 16 such that respective optical axes are coincident with the optical axis AX. An ordinary convex or concave lens, in which a convex or concave surface comprising a spherical surface is formed on at least one side, is used as the lenses 18 respectively. All of the lenses to be used are not necessarily the same, however, the lenses are collectively referred to as the lenses 18 for convenience of explanation.

Secondary lens frames (inner lens frames) $20_1$ to $20_4$ are set inside the primary lens frames (outer lens frames) $14_1$ to $14_4$ with a predetermined clearance provided with respect to the primary lens frames. The primary lens frame $14_1$, for example, comprises a primary lens frame side section $14_1a$ for contacting an outer circumference of the secondary lens frame $20_1$, and a primary lens frame base section $14_1b$ for supporting a bottom of the secondary lens frame $20_1$. An opening, which is smaller than a diameter of the secondary lens frame $20_1$, is formed inside the base section $14_1b$. Each of the other primary lens frames $14_2$ to $14_4$ also includes a side section and a base section in the same manner as the primary lens frame $14_1$, and each of the secondary lens frames $20_2$ to $20_4$ is supported on the base section. Since the secondary lens frames $20_1$ to $20_4$ are supported by the primary lens frames (outer lens frames) $14_1$ to $14_4$ as described above, the secondary lens frames $20_1$ to $20_4$ can be rotated with respect to the primary lens frames $14_1$ to $14_4$ without any tilting. Special lenses $22_1$ to $22_4$ subjected to the astigmatic surface processing are held by the secondary lens frames $20_1$ to $20_4$ respectively. The secondary lens frames $20_1$, $20_2$ for holding the special lenses $22_1$, $22_2$ are arranged adjacent to a position nearest to the reticle R respectively. The secondary lens frames $20_3$, $20_4$ for holding the special lenses $22_3$, $22_4$ are arranged adjacent to a position in the vicinity of a pupil of the projection optical unit 10 respectively.

The special lenses $22_1$ to $22_4$ used in this embodiment are provided, for example, as so-called saddle type convex lenses which have been processed (subjected to the astigmatic surface processing) so that each of the lenses has mutually different radii of curvature concerning two orthogonal cross sections passing through the optical axis. All of those used as the four special lenses $22_1$ to $22_4$ have been subjected to the same astigmatic surface processing, each having a power rotationally asymmetric with respect to the optical axis, which have been consciously set so that the asymmetric component aberration relative to the optical axis is large. Arbitrary asymmetric component aberration relative to the optical axis can be produced by adjusting a relative rotational angle for a combination of two of the special lenses $22_1$ to $22_4$. Namely, when the two of the special lenses $22_1$ to $22_4$ are used as a pair, and they are rotated, then the asymmetric component aberration relative to the optical axis of the projection optical unit 10 can be corrected. More specifically, the rhombus distortion can be easily corrected by adjusting a relative rotational angle between the two special lenses $22_1$, $22_2$ located near the reticle R, and the center astigmatism can be easily corrected by adjusting a relative rotational angle between the two special lenses $22_3$, $22_4$ arranged in the vicinity of the pupil. The four special lenses $22_1$ to $22_4$ have their optical axes which are also coincident with the optical axis AX of the projection optical unit 10 respectively.

The astigmatic surface processing can be performed, for example, by locally processing (polishing) a lens having a spherical surface symmetrical relative to its optical axis so that the lens acquires an asymmetrical spherical surface by using a lens polishing machine capable of three-dimensional processing such as an NC machine tool. The amount of local polishing may be about several hundred nm for a projection lens used for an exposure apparatus for semiconductors. For example, when a lens having a radius of curvature of 500 mm and an outer diameter of 200 mm is subjected to local polishing for 300 nm, a difference in radius of curvature is 0.015 mm. In an alternative method, a lens having an asymmetrical curved surface may be formed by applying a force to a lens having a spherical surface symmetrical relative to its optical axis, in a direction from a side surface to a center of the lens so that the lens is distorted, and performing spherical surface polishing in this state, followed by releasing the force.

FIGS. 6A, 6B, 6C and 6D show examples of positive lens to be polished for producing the special lens $22_1$ (the astigmatic surface-processed lens).

Figure 6A:
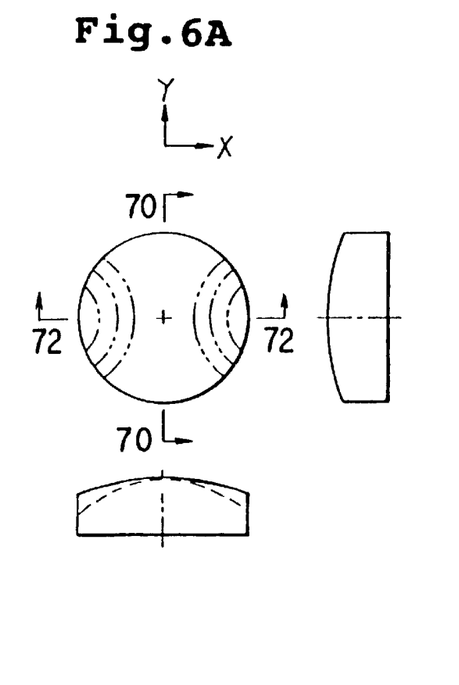
FIG. 6A shows a plane view and its sectional views taken along the lines 70—70 and 72—72 of the positive lens before being subjected to the astigmatic surface processing, and, as a result of the polishing, the positive lens having the specific shape shown by the broken line in the sectional view taken along the lines 72—72 and by continuous line in the sectional view taken along the line 70—70 is obtained.

FIG. 6A shows a plane view and its sectional views taken along the lines 70—70 and 72—72 of the positive lens before being subjected to the astigmatic surface processing. Alternate long and two short dashes line in the plane view shows contour line for polishing. Broken line in the sectional view taken along the 72—72 line shows depth for polishing (depth line). Height of the concave surface of the lens shown by the contour lines decreases as the position of the contour line become closer to the periphery of the lens. The radius of curvature of the concave surface of the lens in the X direction becomes smaller than that in the Y direction by polishing the surface of the lens in accordance with the contour lines and the depth line. The X and Y directions are perpendicular to the optical axis of the lens respectively. As a result of the polishing, the positive lens having the specific shape shown by the broken line in the sectional view taken along the lines 72—72 and by continuous line in the sectional view taken along the line 70—70 is obtained.

Figure 6B:
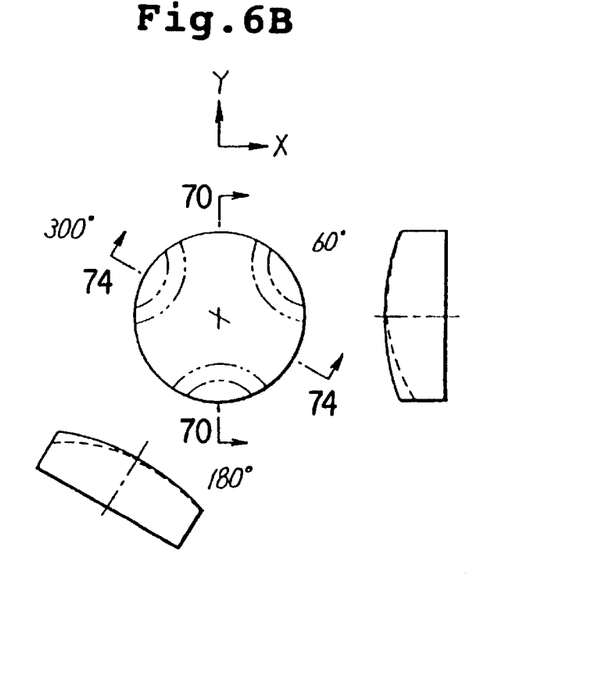
FIG. 6B shows a plane view and its sectional views taken along the lines 70—70 and 74—74 of the positive lens before being subjected to the astigmatic surface processing, as a result of polishing the surface of the lens in the direction of 60°, 180° and 300° in accordance with the contour lines and the depth lines, the positive lens having the specific shape shown by the broken line in the sectional view taken along the line 70—70 and the broken line in the sectional view taken along the line 74—74 is obtained.

FIG. 6B shows a plane view and its sectional views taken along the lines 70—70 and 74—74 of the positive lens before being subjected to the astigmatic surface processing. Alternate long and two short dashes line in the plane view shows contour line for polishing. Broken lines in the sectional view taken along the lines 70—70 and 74—74 show depth lines for polishing. Height of the lens surface shown by the contour lines decreases in the direction of 60°, 180° and 300° as the position of the contour lines become closer to the periphery of the lens. As a result of polishing the surface of the lens in the direction of 60°, 180° and 300° in accordance with the contour lines and the depth lines, the positive lens having the specific shape shown by the broken line in the sectional view taken along the line 70—70 and the broken line in the sectional view taken along the line 74—74 is obtained.

Figure 6C:
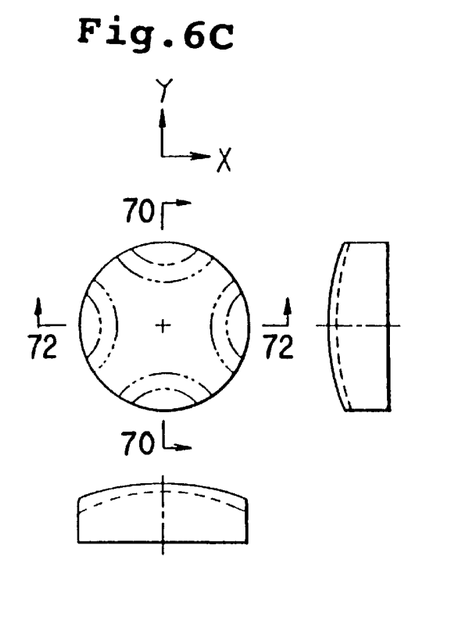
FIG. 6C shows a plane view and its sectional views of the positive lens in which the lens surface is polished not only in the X direction but in the Y direction with the larger radius of curvature than that in the X direction in FIG. 6A.

FIG. 6C shows a case in which the lens surface is polished not only in the X direction but in the Y direction with the larger radius of curvature than that in the X direction in FIG. 6A. Thus, the depth for polishing at the both side of the lens in the sectional view taken along the line 70—70 is deeper than that in the sectional view taken along the 72—72 line.

Figure 6D:
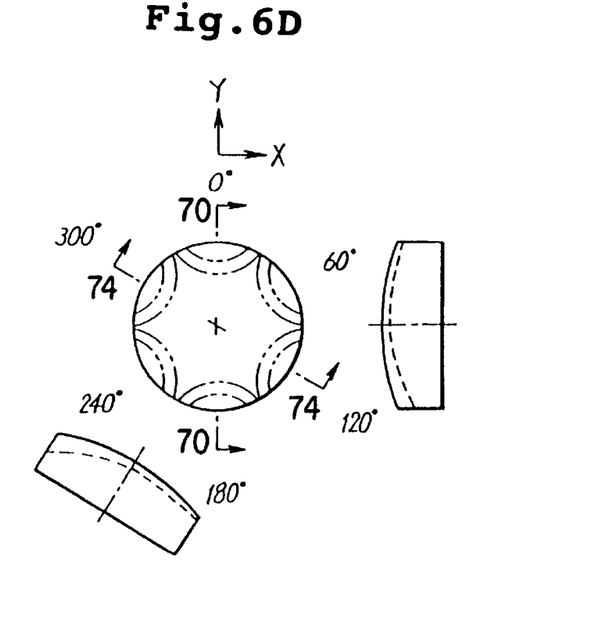
FIG. 6D shows a plane view and its sectional views of the positive lens in which the lens surface is polished not only in the direction of 60°, 180° and 300°, but in the direction of 0°, 120°, and 240° in FIG. B.

FIG. 6D shows a case in which the lens surface is polished not only in the direction of 60°, 180° and 300°, but in the direction of 0°, 120°, and 240° in FIG. B. The polishing amount in the direction of 0°, 120°, and 240° is controlled such that the radius of curvature of the lens surface in this direction is larger than that of in the direction of 60°, 180° and 300°. The depths of polishing are different each other at the center of the lens the both sides of the lens in 70—70 line sectional view (also the 74—74 line sectional view).

The lenses $22_2$ to $22_4$ are also obtained by the same astigmatic surface processing, which may have the same shape as that of the lens $22_1$.

Figure 4:
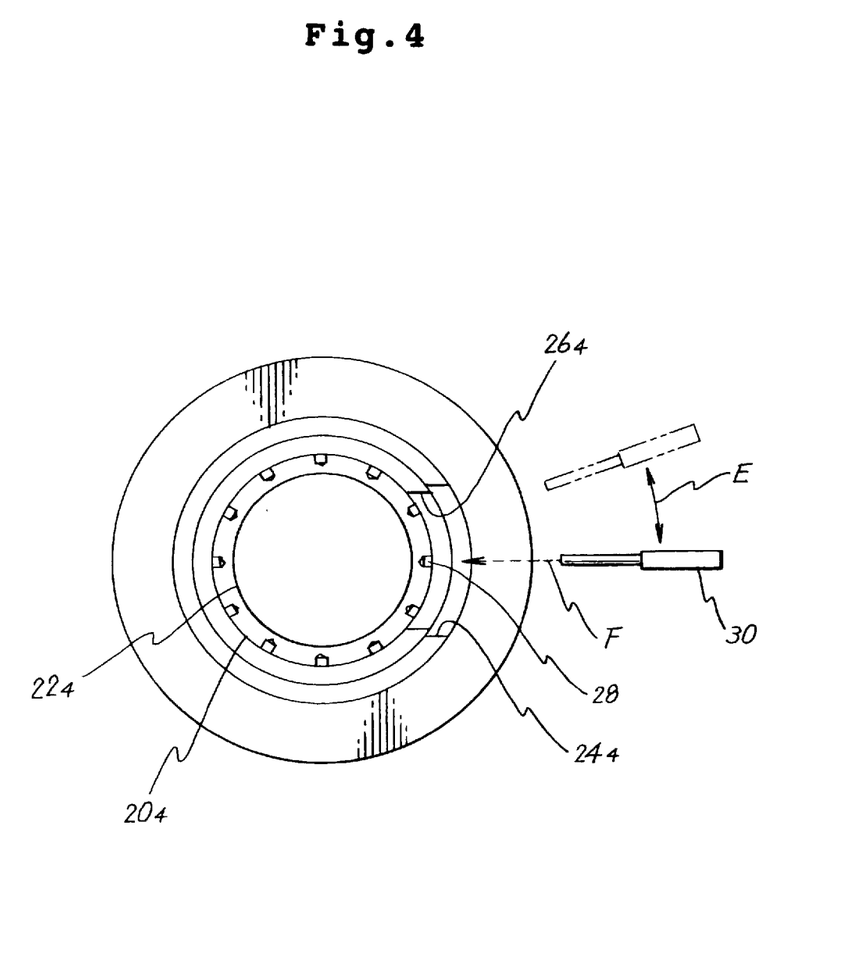
FIG. 4 shows a cross-sectional view taken along a line 72—72 in FIG. 1, illustrating an example of a rotating mechanism for rotating a lens.

Now the primary lens frame and the secondary lens frame will be described in further detail below. As shown in FIG. 2, openings $24_1$ to $24_4$, which are provided as elongated holes extending in the circumferential direction, are formed at portions corresponding to the primary lens frames $14_1$ to $14_4$ respectively on a right side of the lens barrel 12 in FIG. 1. An elongated hole $26_4$, for example, which has a shape similar to that of the opening $24_4$ and which is slightly smaller than the opening $24_4$, is formed through a circumferential wall of the primary lens frame $14_4$ opposing to the opening $24_4$ as shown in FIGS. 2 and 4. As shown in FIG. 4, a plurality (12 individuals in this embodiment) of circular holes 28 are formed and spaced apart by an equal distance in the circumferential direction at an outer circumference of a circumferential wall of the secondary lens frame $20_4$ corresponding to a position in height (position in the direction of the optical axis AX) at which the elongated hole $26_4$ is provided. The circular holes 28 are provided for inserting a lever 30 (engaging member) thereinto. The special lens $22_4$ can be rotated (revolved) integrally with the secondary lens frame $20_4$ about the optical axis AX as the center by inserting the lever 30 into the circular hole 28 as illustrated by an arrow F depicted by dotted lines in FIG. 4 to make rotation in a direction of an arrow E. In this embodiment, the circular holes 28 are provided at a spacing of 30 degrees. Accordingly, when the lever 30 is rotated by 30 degrees, for example, the next circular hole 28 comes to a position at which the lever 30 was originally located. The degree of rotation of the secondary lens frame $20_4$ can be easily known by counting the number of circular holes 28 having passed through a predetermined position of the opening $24_4$ or the elongated hole $26_4$ during the rotation. Of course, when a scale is previously provided on the outer circumference of the secondary lens frame $20_4$, it is unnecessary to count the number of circular holes 28. In the same manner as described above, elongated holes $26_1$ to $26_3$, which are slightly smaller than the openings $24_1$ to $24_3$, are also formed at circumferential walls of the primary lens frames $14_1$ to $14_3$ opposing to the other openings $24_1$ to $24_3$ respectively as shown in FIGS. 1 and 2. Circular holes 28 (12 individuals) are formed and spaced apart by the equal distance in the circumferential direction at outer circumferences of circumferential walls of the secondary lens frames $20_1$ to $20_3$ corresponding to positions in height at which the elongated holes $26_1$ to $26_3$ are provided respectively. The secondary lens frames $20_1$ to $20_3$ can be easily rotated respectively by inserting the lever 30 into each of the circular holes 28.

A set of circular holes 32 are bored at positions over each of the openings $24_1$ to $24_4$ of the lens barrel 12 as shown in FIGS. 1 and 2. Each of the circular holes 32 is provided for insertion of a screw described below for fixing the secondary lens frame. Therefore, as shown in an enlarged view in FIG. 3, a tapped hole 34 is formed through the circumferential wall of each of the primary lens frames $14_1$ to $14_4$ at a portion opposing to the circular hole 32.

Figure 3:
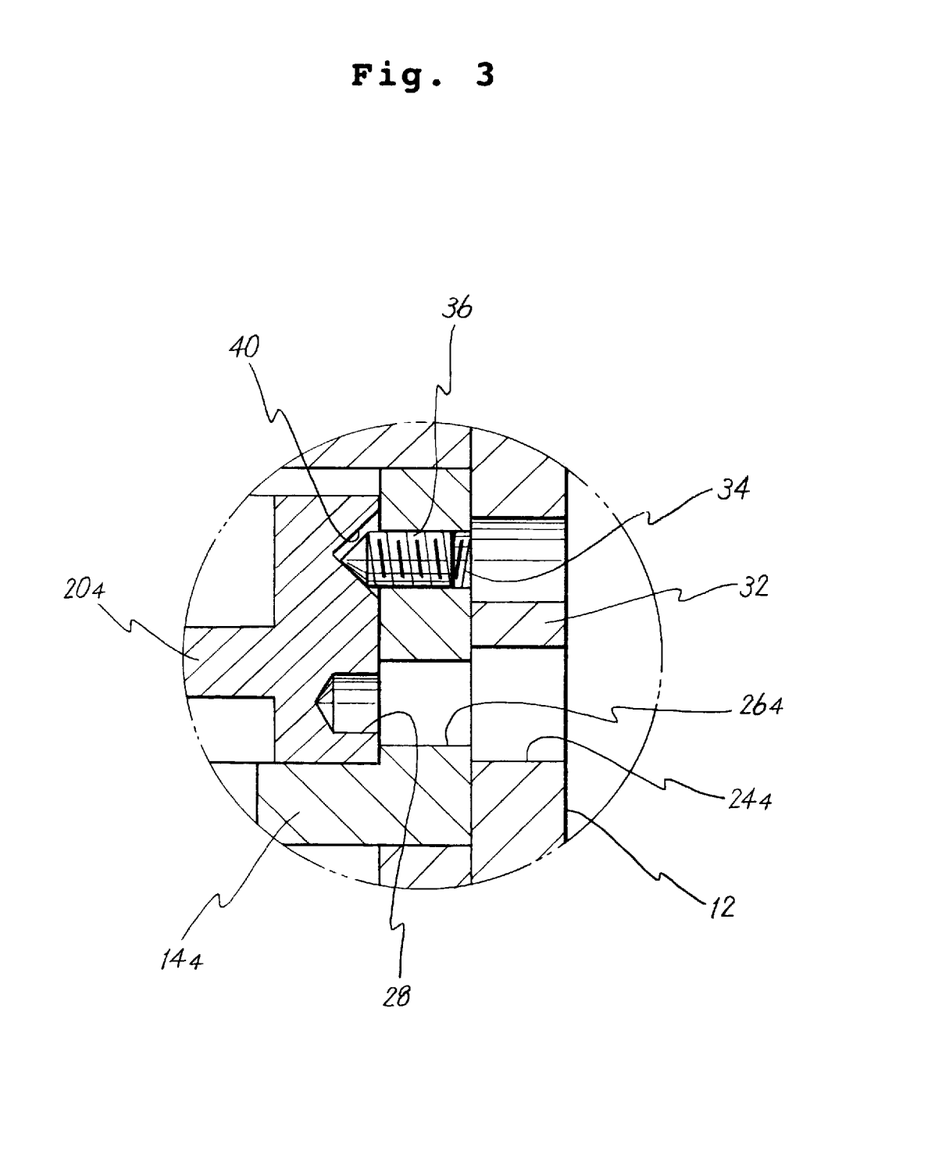
FIG. 3 shows an enlarged view of a circular portion A in FIG. 1, illustrating a structure for fixing a secondary lens frame to a primary lens frame.

As shown in the enlarged view in FIG. 3, a screw 36 formed with its conical forward end is screwed into each of the tapped holes 34. A cut-out engageable with a screwdriver 38 (which may be any one of HEX screwdriver, plus screwdriver, and minus screwdriver) is formed on an end surface opposite to the forward end of the screw 36. The forward end of the screw 36 is forcedly contacted with an inclined surface of an annular recessed groove 40 having a V-shaped cross section formed at the outer circumference of each of the secondary lens frames $20_1$ to $20_4$. Namely, as shown in FIG. 3, a structure is provided in which the forward end surface of the screw 36 presses the inclined surface, and thus the secondary lens frames $20_1$ to $20_4$ can be fixed at arbitrary positions in the rotational direction. The circular holes 32 and the tapped holes 34 for inserting the screw 36 thereinto may be provided on the circumference as three or more individuals respectively spaced apart by an equal spacing distance. Usually, they are adequately provided as four or eight individuals respectively from a viewpoint of operation.

According to the projection optical unit 10 of this embodiment constructed as described above, the secondary lens frame 20 and the special lens 22 held by it can be easily rotated in a state in which all of the lens frames and the lenses are incorporated, by inserting the screwdriver 38 through the circular hole 32 to loosen the screw, and inserting the lever 30 into the circular hole 28 of the secondary lens frame 20 through the opening 24 to make rotation. After adjustment for rotation, the screw 36 is tightened by using the screwdriver 38. Thus the secondary lens frame 20 can be simply fixed by the screw 36 at an adjusted position.

As clarified from the foregoing explanation, a rotating mechanism for independently rotating each of the special lenses 22 by using the lever 30 is constructed in this embodiment by the primary lens frames 14, the secondary lens frames 20, the openings 24 formed through the lens barrel 12, the elongated holes 26 formed through the primary lens frames 14, and the circular holes 28 provided in the secondary lens frames 20.

As explained above, according to this embodiment, the secondary lens frame 20 which holds the special lens 22 can be arbitrarily rotated from the outside of the lens barrel 12. Therefore, various image formation characteristics, especially the asymmetric component aberration of the optical axis can be easily corrected without disassembling the unit in a state in which all of the lens frames are incorporated into the lens barrel 12. Accordingly, the projection optical unit 10 can be adjusted in a short period of time during a production step for the single projection optical unit 10 or during a production step after installation of the projection optical unit 10 to a main exposure apparatus body.

According to this embodiment, the projection optical unit 10 can be simply adjusted in mid course of production of the exposure apparatus so that components of the rhombus distortion and the center astigmatism of the projection optical unit 10 are decreased. Accordingly, the image formation characteristics of the projection optical unit 10 are improved.

The embodiment described above has exemplified the case in which the two special lenses subjected to the astigmatic surface processing are located at the position near to the reticle, the two special lenses are located at the position in the vicinity of the pupil, and they are simultaneously used in order to correct the components of the rhombus distortion and the center astigmatism. However, the present invention is not limited thereto. Alternatively, for example, only the two special lenses subjected to the astigmatic surface processing may be used at the position near to the reticle, or only the two special lenses may be used at the position in the vicinity of the pupil. Essentially, it is satisfactory to use at least two of the lenses subjected to the astigmatic surface processing.

Figure 5:
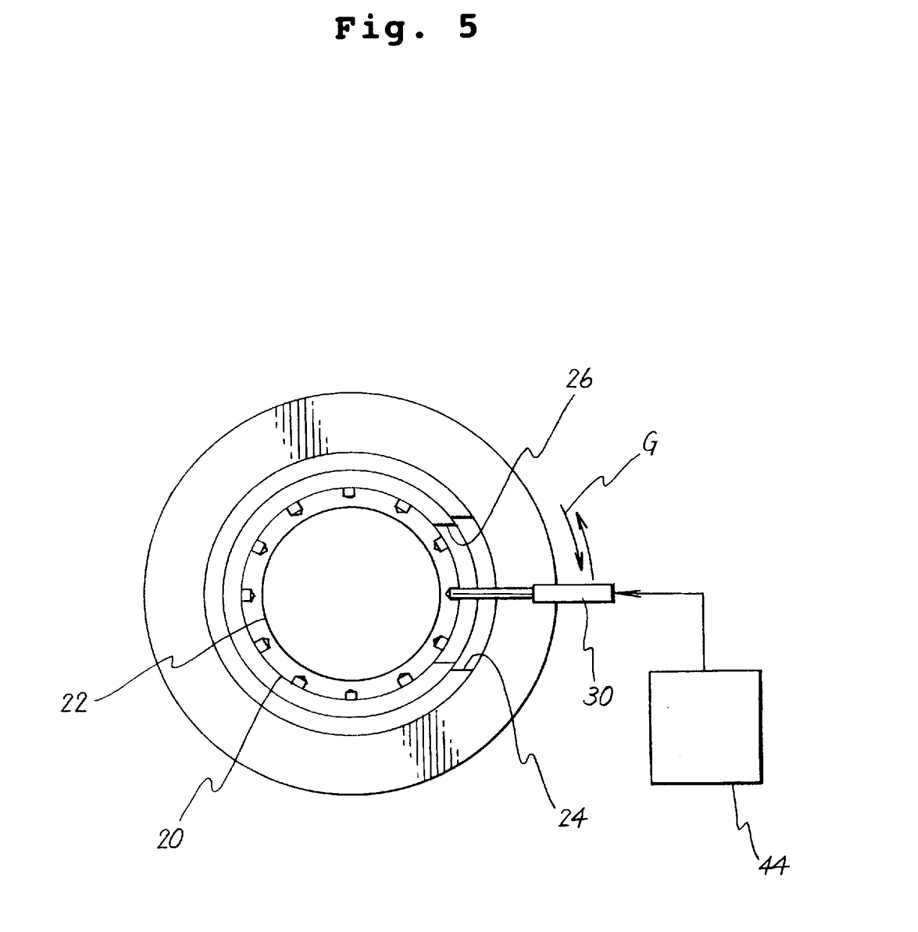
FIG. 5 shows a cross-sectional view taken along a line 72—72 in FIG. 1, illustrating another example of a rotating mechanism for rotating a lens.

The embodiment described above has exemplified the case in which the secondary lens frame 20 which holds the special lens 22 is rotated manually. However, as shown in FIG. 5, it is also available to provide a driving unit 44 for rotating the secondary lens frame 20 in a direction of an arrow G and a direction opposite thereto in a state in which the lever 30 is inserted into the circular hole 28. In order to correct the asymmetric component aberration of the optical axis, it is sufficient that each of a pair of two special lenses 22 can be rotated within an angle range of ±90 degrees. Accordingly, when a structure as shown in FIG. 5 is adopted, it is desirable that each of the secondary lens frames 20 can be rotated within such an angle range.

The embodiment described above has exemplified the case in which all of the special lenses $22_1$ to $22_4$ are held by the lens frames having the double structure comprising the primary and secondary lens frames. However, in some cases, the pressing force (axial tension) exerted on the two special lenses $22_1$, $22_2$ located near to the reticle is possibly not so large. Accordingly, it is not necessarily indispensable that the lens frame has the double structure comprising the primary and secondary lens frames. Alternatively, a single lens frame may be rotated from the outside of the lens barrel 12 in accordance with the same technique as described in the aforementioned embodiment.

The embodiment described above has illustrated the structure in which the lens subjected to the astigmatic surface processing is rotated from the outside of the barrel. However, the present invention is not limited thereto. For example, a structure may be adopted in which an ultrasonic motor is provided between the secondary lens frame and the primary lens frame to directly rotate the secondary lens frame. It is also possible to adopt a structure in which an air cylinder is utilized to externally push and rotate the secondary lens frame. Alternatively, a structure may be adopted in which an actuator or a motor provided with gears is installed in the barrel so that the secondary lens frame may be rotated and moved with respect to the primary lens frame. Alternatively, the distortion and the astigmatism of the projection optical unit 10 may be measured by using a method disclosed in U.S. Pat. No. 4,629,313, and the secondary lens frame may be rotated on the basis of a result of the measurement.

The projection optical unit of the present invention can be installed to projection exposure apparatuses of various exposure systems such as the so-called step-and-repeat system (system to repeat static exposure and wafer stage stepping) as described in U.S. Pat. No. 5,117,255 and the so-called step-and-scan system (system to repeat wafer stage stepping and scanning exposure for performing exposure while synchronously scanning a reticle and a wafer) as described, for example, in U.S. Pat. Nos. 5,194,893 and 4,924,257. The image formation characteristics can be easily adjusted in the projection exposure apparatus provided with the projection optical unit of the present invention. Accordingly, it is expected to improve the throughput of semiconductor production.

As explained above, according to the present invention, the asymmetric component aberration relative to the optical axis of the optical system comprising all of the lenses for constituting the projection optical unit can be easily corrected by relatively rotating a pair of two of the lenses subjected to the astigmatic surface processing. Accordingly, especially the asymmetric component aberration can be corrected in a short period of time. In particular, the lens subjected to the astigmatic surface processing can be rotated and set at an arbitrary angle without disassembling the unit. Accordingly, the image formation characteristics of the optical system which constitutes the projection optical unit, especially the asymmetric component aberration relative to the optical axis can be efficiently adjusted during a production step for the single projection optical unit or during a production step after installation of the projection optical unit to a main exposure apparatus body. Therefore, it is expected to improve the throughput of semiconductor production by using the projection exposure apparatus provided with the projection optical unit.

In the embodiment described above, the lens is used as the optical element for constituting the projection optical unit. However, the present invention may be applied to a catadioptric system in which one or more mirrors are adopted for a part of the system. Alternatively, a mirror may be used as the optical element subjected to the astigmatic surface processing.

The present invention may be practiced or embodied in other various forms without departing from the spirit or essential characteristics thereof. It will be understood that the scope of the present invention is indicated by the appended claims, and all variations and modifications which come within the equivalent range of the claims are embraced in the scope of the present invention.

What is claimed is:

1. A projection optical unit for projecting a pattern on a mask onto a substrate, comprising:

a barrel;

a plurality of optical elements held coaxially in the barrel;

at least two optical elements of the plurality of optical elements being optical elements which produce asymmetric component aberration relative to an optical axis of the optical elements; and a rotating mechanism that relatively rotates the at least two optical elements about the optical axis respectively;

said rotating mechanism comprising inner optical element frames, which are rotatable in the barrel about the optical axis as a center, that hold the at least two optical elements respectively, and outer optical element frames, which are arranged between the inner optical element frames and the barrel, that rotatably support the inner optical element frames.

2. The projection optical unit according to claim 1, wherein said at least two optical elements are lenses each having a shape with its radii of curvature rotationally asymmetrically different relative to the optical axis.

3. The projection optical unit according to claim 2, wherein said at least two optical elements are lenses each having mutually different radii of curvature in two orthogonal cross sections passing through the optical axis.

4. The projection optical unit according to claim 1, wherein said at least two optical elements are mirrors each having a shape with its radii of curvature rotationally asymmetrically different relative to the optical axis.

5. The projection optical unit according to claim 1, wherein said rotating mechanism rotates said at least two optical elements from the outside of the barrel respectively.

6. The projection optical unit according to claim 1, wherein said rotating mechanism comprises an engaging member that engages one of the inner optical element frames and rotates the one of the inner optical element frames.

7. The projection optical unit according to claim 1, wherein two optical elements of said at least two optical elements are disposed adjacent to an end of the barrel on a side of the mask.

8. The projection optical unit according to claim 1, wherein two optical elements of said at least two optical elements are disposed adjacent to a position in the vicinity of a pupil of an optical system formed by the plurality of optical elements.

9. The projection optical unit according to claim 1, wherein an image formation characteristic of the projection optical unit is corrected by independently rotating said at least two optical elements about the optical axis respectively.

10. The projection optical unit according to claim 9, wherein the image formation characteristic to be corrected is at least one of distortion and center astigmatism.

11. A projection exposure apparatus for exposing a photosensitive substrate by projection with a pattern on a mask, comprising:

an illuminating unit that illuminates the mask; and a projection optical unit that forms an image of the mask pattern on the photosensitive substrate;

said projection optical unit comprising:

a barrel;

a plurality of optical elements held coaxially in the barrel;

at least two optical elements of the plurality of optical elements being optical elements which produce asymmetric component aberration relative to an optical axis of the optical elements; and a rotating mechanism that relatively rotates the at least two optical elements about the optical axis respectively; and said rotating mechanism comprising inner optical element frames, which are rotatable in the barrel about the optical axis as a center, that hold the at least two optical elements respectively, and outer optical element frames, which are arranged between the inner optical element frames and the barrel, that rotatably support the inner optical element frames.

12. The projection exposure apparatus according to claim 11, wherein said projection exposure apparatus is a projection exposure apparatus of one of a step-and-repeat type and a step-and-scan type.

13. The projection exposure apparatus according to claim 11, wherein said at least two optical elements are lenses each having a shape with its radii of curvature rotationally asymmetrically different relative to the optical axis.

14. The projection exposure apparatus according to claim 13, wherein said at least two optical elements are lenses each having mutually different radii of curvature in two orthogonal cross sections passing through the optical axis.

15. The projection exposure apparatus according to claim 11, wherein said at least two optical elements are mirrors each having a shape with its radii of curvature rotationally asymmetrically different relative to the optical axis.

16. The projection exposure apparatus according to claim 11, wherein said rotating mechanism rotates said at least two optical elements from the outside of the barrel respectively.

17. The projection exposure apparatus according to claim 11, wherein said rotating mechanism comprises an engaging member that engages one of the inner optical element frames and rotates the one of the inner optical element frames.

18. The projection exposure apparatus according to claim 11, wherein two optical elements of said at least two optical elements are disposed adjacent to an end of the barrel on a side of the mask.

19. The projection exposure apparatus according to claim 11, wherein two optical elements of said at least two optical elements are disposed adjacent to a position in the vicinity of a pupil of an optical system formed by the plurality of optical elements.

20. The projection exposure apparatus according to claim 11, wherein an image formation characteristic of the projection exposure apparatus is corrected by independently rotating said at least two optical elements about the optical axis respectively.

21. The projection exposure apparatus according to claim 20, wherein the image formation characteristic to be corrected is at least one of distortion and center astigmatism.

22. A projection optical unit for projecting an image of a first object onto a second object, comprising:

a barrel;

a plurality of optical elements held coaxially in the barrel;

at least two optical elements of the plurality of optical elements being lenses each having different radii of curvature;

a rotating mechanism that relatively rotates the at least two optical elements about an optical axis of the optical elements respectively;

said rotating mechanism comprising optical element frames, each of which is rotatable in the barrel about the optical axis, that hold the at least two optical elements respectively.

23. The projection optical unit according to claim 22, wherein said at least two optical elements are lenses each having a shape with its radii of curvature rotationally asymmetrically different relative to the optical axis.

24. The projection optical unit according to claim 23, wherein said at least two optical elements are lenses each having mutually different radii of curvature in two orthogonal cross sections passing through the optical axis.

25. A projection exposure apparatus for projecting a mask pattern onto a substrate through a projection optical system;

a barrel of the projection optical system;

a plurality of optical elements held coaxially in the barrel;

at least two optical elements of the plurality of optical elements being lenses each having different radii of curvature;

a rotating mechanism that relatively rotates the at least two optical elements about an optical axis of the optical elements;

said rotating mechanism comprising optical element frames, each of which is rotatable in the barrel about the optical axis, that hold the at least two optical elements respectively, wherein asymmetric aberration of the projection optical system is corrected by relatively rotating the at least two optical elements by virtue of the rotating mechanism.

26. The projection exposure apparatus according to claim 25, wherein said at least two optical elements are lenses each having a shape with its radii of curvature rotationally asymmetrically different relative to the optical axis.

27. The projection exposure apparatus according to claim 26, wherein said at least two optical elements are lenses each having mutually different radii of curvature in two orthogonal cross sections passing through the optical axis.

28. A method for adjusting an image formation characteristic of a projection optical unit, which has a barrel of the projection optical unit a plurality of optical elements held coaxially in the barrel and at least two optical element frames each holding one of the optical elements and independently rotatable in the barrel about an optical axis of the projection optical unit, that projects an image of a first object onto a second object, each of the optical elements having different radii of curvature with respect to an optical axis of the projection optical system, the method comprising:

relatively rotating the at least two optical element frames so that the asymmetric aberration of the projection optical system is corrected.

29. A method for manufacturing an exposure apparatus having a projection optical system, the projection optical system having an optical axis, the method comprising the steps of:

providing a barrel having at least first and second lenses therein, the first and second lenses each having radii of curvature rotationally asymmetrically different relative to the optical axis;

providing a first frame that holds the first lens; and providing a second frame that holds the second lens.

30. The method according to claim 29, further comprising the steps of providing a first outer frame between the first frame and the barrel, and providing a second outer frame between the second frame and the barrel.

31. The method according to claim 29, wherein each of the first and second lenses is disposed adjacent to a position in the vicinity of a pupil of the projection optical system.

32. The method according to claim 31, wherein an astigmatism of the projection optical system is corrected by relatively rotating the first and second frames.

33. The method according to claim 29, wherein the exposure apparatus exposes a substrate with a pattern on a mask through the projection optical system, and a pair of the first and second lenses is disposed adjacent to at least one of a position in the vicinity of a pupil of the projection optical system and a mask end of the barrel.

34. The method according to claim 33, wherein two pairs of the first and second lenses are disposed adjacent to the position in the vicinity of the pupil of the projection optical system and the mask end of the barrel, respectively, and an astigmatism is corrected by the pair of the lenses disposed adjacent to the position in the vicinity of the pupil of the projection optical system and a distortion is corrected by the pair of lenses disposed adjacent to the mask end of the barrel.

35. The method according to claim 29, wherein each of the first and second lenses has mutually different radii of curvature in two orthogonal cross sections passing through an optical axis of each lens.

36. The method according to claim 29, wherein an aberration of the projection optical system is corrected by relatively rotating the first and second frames.

37. The method according to claim 36, wherein the aberration is at least one of distortion and astigmatism.

38. A substrate formed by using the exposure apparatus manufactured by the method defined in claim 29.

* * * * *